(12) United States Patent
Langfelder et al.

(10) Patent No.: US 10,254,355 B2
(45) Date of Patent: *Apr. 9, 2019

(54) MAGNETIC SENSOR INCLUDING A LORENTZ FORCE TRANSDUCER DRIVEN AT A FREQUENCY DIFFERENT FROM THE RESONANCE FREQUENCY, AND METHOD FOR DRIVING A LORENTZ FORCE TRANSDUCER

(71) Applicant: STMicroelectronics S.r.l., Agrate Brianza (IT)

(72) Inventors: Giacomo Langfelder, Milan (IT); Alessandro Tocchio, Milan (IT); Dario Paci, Sedriano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/584,672

(22) Filed: May 2, 2017

(65) Prior Publication Data

US 2017/0234940 A1  Aug. 17, 2017

Related U.S. Application Data

(63) Continuation of application No. 14/446,248, filed on Jul. 29, 2014, now Pat. No. 9,671,471.

(30) Foreign Application Priority Data

Jul. 31, 2013  (IT) .............................. TO2013A0653

(51) Int. Cl.
G01R 33/028 (2006.01)
G01R 33/02 (2006.01)
(Continued)

(52) U.S. Cl.
CPC ..... *G01R 33/0283* (2013.01); *G01R 33/0064* (2013.01); *G01R 33/028* (2013.01);
(Continued)

(58) Field of Classification Search
CPC . G01R 33/0286; G01R 33/028; G01R 33/038
See application file for complete search history.

(56) References Cited

U.S. PATENT DOCUMENTS 6,501,268 B1 * 12/2002 Edelstein ............... G01R 33/02
324/225
7,642,692 B1  1/2010 Pulskamp
(Continued)

FOREIGN PATENT DOCUMENTS

MX  2010013040 A  5/2012

OTHER PUBLICATIONS

Comi et al., "A Resonant Microaccelerometer With High Sensitivity Operating in an Oscillating Circuit," Journal of Microelectromechanical Systems, vol. 19, No. 5, Oct. 2010, pp. 1140-1152.
(Continued)

*Primary Examiner* — Huy Q Phan
*Assistant Examiner* — Zannatul Ferdous
(74) *Attorney, Agent, or Firm* — Seed IP Law Group LLP (57) ABSTRACT

A magnetic field sensor includes a die and a current generator in the die. The current generator generates a driving current. A Lorentz force transducer is also formed in the die and coupled to the current generator to obtain measurements of a magnetic field based upon the Lorentz force. The magnetic field has a resonance frequency and the current generator drives the Lorentz force sensor with the driving current having a non-zero frequency different from the resonance frequency.

20 Claims, 4 Drawing Sheets

(51) Int. Cl.
  *G01R 33/00*    (2006.01)
  *H01L 41/08*    (2006.01)
  *H01L 41/113*   (2006.01)
  *G01R 33/038*   (2006.01)

(52) U.S. Cl.
  CPC ..... *G01R 33/0213* (2013.01); *G01R 33/0286* (2013.01); *G01R 33/038* (2013.01); *H01L 41/08* (2013.01); *H01L 41/1132* (2013.01)

(56) References Cited

U.S. PATENT DOCUMENTS

| | | | | |
|---|---|---|---|---|
| 8,181,874 | B1* | 5/2012 | Wan | H04M 1/72522 235/435 |
| 8,278,919 | B2 | 10/2012 | Fischer et al. | |
| 9,671,471 | B2* | 6/2017 | Langfelder | G01R 33/028 |
| 2009/0015250 | A1* | 1/2009 | Sunier | G01R 33/028 324/244 |
| 2011/0140693 | A1* | 6/2011 | Baldo | G01R 33/0005 324/244 |
| 2011/0192229 | A1* | 8/2011 | Chen | G01R 33/0286 73/514.32 |
| 2012/0086446 | A1 | 4/2012 | Shaeffer et al. | |
| 2012/0176128 | A1 | 7/2012 | Seeger et al. | |
| 2014/0084906 | A1* | 3/2014 | Ruigrok | G01D 5/147 324/207.21 |

OTHER PUBLICATIONS

Emmerich et al., "Magnetic field measurements with a novel surface micromachined magnetic-field sensor," IEEE Transactions on Electron Devices 47(5):972-977, May 2000.

Langfelder et al., "Operation of Lorentz-Force MEMS Magnetometers With a Frequency Offset Between Driving Current and Mechanical Resonance," IEEE Transactions on Magnetics, vol. 50, No. 1, Jan. 2014, 6 pages.

Thompson et al., "Low Power 3-Axis Lorentz Force Navigation Magnetometer," IEEE 24th International Conference on Micro Electro Mechanical Systems, Cancun, MX, Jan. 23-27, 2011, pp. 593-596.

Tocchio et al., "Enhancing the Linear Range of MEMS Resonators for Sensing Applications," IEEE Sensors Journal, vol. 11, No. 12, Dec. 2011, pp. 3202-3210.

* cited by examiner

MAGNETIC SENSOR INCLUDING A LORENTZ FORCE TRANSDUCER DRIVEN AT A FREQUENCY DIFFERENT FROM THE RESONANCE FREQUENCY, AND METHOD FOR DRIVING A LORENTZ FORCE TRANSDUCER

BACKGROUND

Technical Field

The present disclosure relates to a magnetic sensor including a Lorentz force transducer, which is driven at a frequency different from its natural resonance frequency. Furthermore, the present disclosure relates to a method for driving a Lorentz force transducer.

Description of the Related Art

As is known, today available are the so-called magnetic sensors based upon the Lorentz force, which are also known as Lorentz force magnetometers and exploit, precisely, the Lorentz force to obtain measurements of magnetic field, as described, for example, in U.S. Pat. No. 7,642,692.

Lorentz force magnetometers represent a valid alternative, for example, to Hall sensors and to the so-called anisotropic magnetoresistive (AMR) sensors. In particular, Lorentz force magnetometers are suited to form single-chip triaxial sensors; moreover, these magnetometers can be integrated with gyroscopes, so as to form sensors with nine axes. However, Lorentz force magnetometers feature non-negligible levels of consumption, as well as not particularly wide bandwidths.

Figure 1:
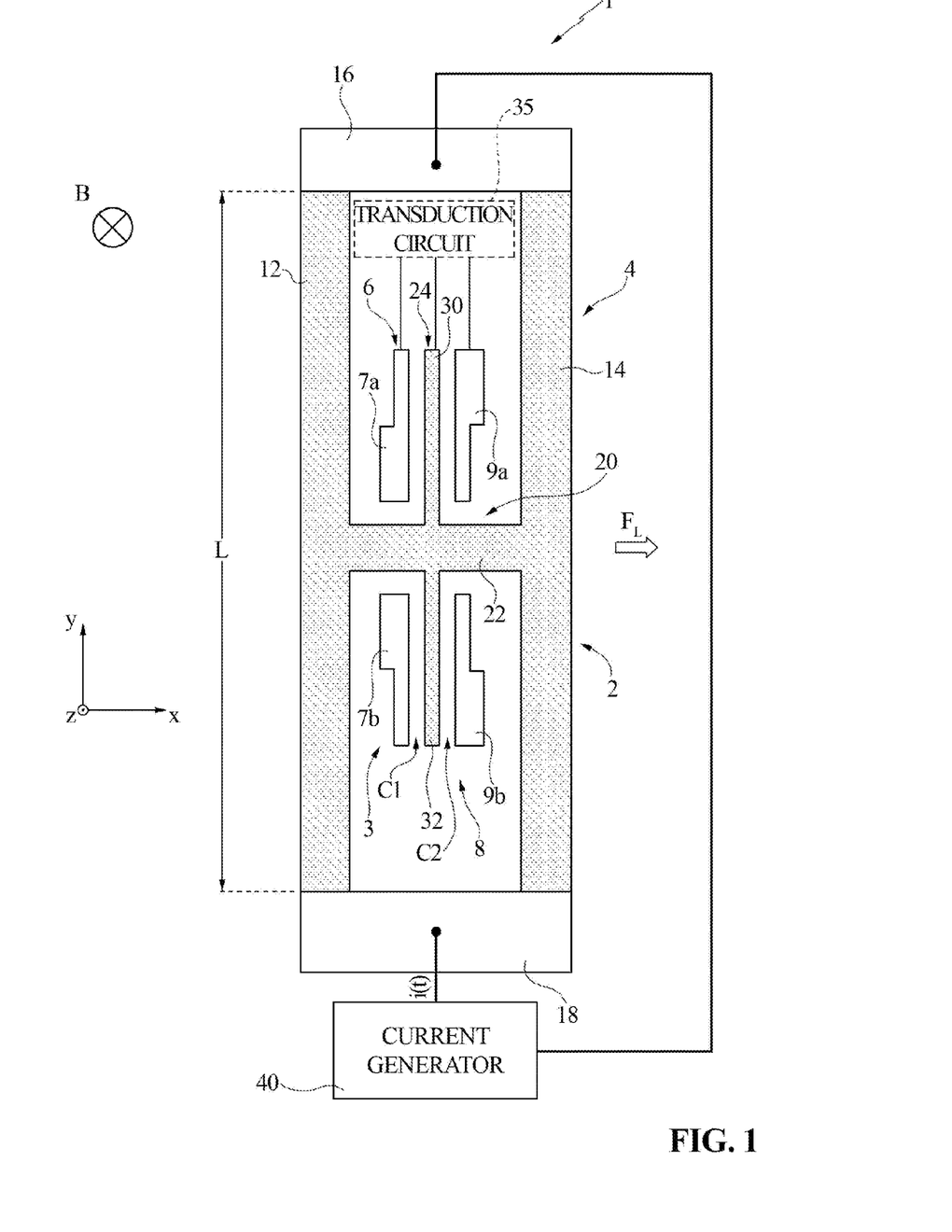
FIG. 1 shows schematically a cross section of a magnetometer based upon the Lorentz force of a known type.

In general, the principle of operation of a magnetometer based upon the Lorentz force is exemplified in FIG. 1, where a magnetometer of this type is in fact shown, designated as a whole by 1, and referred to in what follows for brevity as "magnetometer 1".

The magnetometer 1 comprises a transducer 2, which is of the MEMS (microelectromechanical systems) type and in turn comprises a stator 3 and a rotor 4. The stator 3 comprises a first fixed electrode 6 and a second fixed electrode 8, made of semiconductor material.

The first fixed electrode 6 comprises a first fixed-electrode subregion 7a and a second fixed-electrode subregion 7b, which are electrically connected to one another and are fixed with respect to a substrate (not shown), which is made, for example, of semiconductor material.

The second fixed electrode 8 comprises a third fixed-electrode subregion 9a and a fourth fixed-electrode subregion 9b, which are electrically connected to one another, are electrically separated from the first and second fixed-electrode subregions 7a, 7b and are fixed with respect to the substrate.

The substrate mechanically carries the first, second, third, and fourth fixed-electrode subregions 7a-7b, 9a-9b.

The rotor 4 comprises a first suspended element 12 and a second suspended element 14, which are physically suspended, at a distance, over the substrate. The first and second suspended elements 12, 14 have shapes, for example, of parallelepipeds with a length equal to L, measured along the axis y of an orthogonal reference system xyz. Furthermore, the first and second suspended elements 12, 14 are arranged so as to be parallel to one another and aligned along the axis x.

The first and second suspended elements 12, 14 may be made, for example, of semiconductor material. In addition, each of the first and second suspended elements 12, 14 has a first end and a second end opposite to one another, which are fixed, respectively, to a first anchorage element 16 and a second anchorage element 18, which are in turn fixed with respect to the substrate. The first and second anchorage elements 16, 18 are made of semiconductor material.

The rotor 4 further comprises a third suspended element 20, which is made, for example, of semiconductor material and comprises a first suspended-element subregion 22 and a second suspended-element subregion 24, which are fixed with respect to one another.

The first suspended-element subregion 22 has an elongated shape, extends along the axis x and is provided with a first end and a second end, which are opposite to one another and are constrained, respectively, to the first and second suspended elements 12, 14. In particular, the first end of the first suspended-element subregion 22 is fixed to a central portion of the first suspended element 12, whereas the second end of the first suspended-element subregion 22 is fixed to a central portion of the second suspended element 14. Furthermore, the first suspended-element subregion 22 extends between the first fixed-electrode subregion 7a and the third fixed-electrode subregion 9a, on one side, and the second and fourth fixed-electrode subregions 7b, 9b, on the other.

The second suspended-element subregion 24 includes a first cantilever element 30 and a second cantilever element 32, each of which has an elongated shape, for example parallelepipedal. Furthermore, each of the first and second cantilever elements 30, 32 has a respective first end and a respective second end, opposite to one another; the first end is fixed to a central portion of the first suspended-element subregion 22, whereas the second end is free.

In detail, the first and second cantilever elements 30, 32 extend parallel to the axis y, hence parallel to the first and second suspended elements 12, 14, and are moreover arranged specularly with respect to the first suspended-element subregion 22. Furthermore, the first cantilever element 30 is arranged, at a distance, between the first and third fixed-electrode subregions 7a, 9a, whereas the second cantilever element 32 is arranged, at a distance, between the second and fourth fixed-electrode subregions 7b, 9b.

In greater detail, in the magnetometer 1, the first and second cantilever elements 30, 32 form a single piece with the first suspended-element subregion 22. Furthermore, the first, second, and third suspended elements 12, 14, 20 form a single piece.

For practical purposes, the first and second fixed-electrode subregions 7a, 7b form a first plate of a first capacitor C1, the second plate of which is formed by the first and second cantilever elements 30, 32. Furthermore, the third and fourth fixed-electrode subregions 9a, 9b form a first plate of a second capacitor C2, the second plate of which is formed once again by the first and second cantilever elements 30, 32.

The magnetometer 1 further comprises a transduction circuit 35 and a current generator 40.

The transduction circuit 35 is electrically connected to the first plates of the first and second capacitors C1, C2, as well as to the second (shared) plate of the second cantilever element 30.

The current generator 40 is electrically coupled to the transducer 2. In particular, the current generator 40 is electrically coupled to the first and second anchorage elements 16, 18 and is such as to generate, in use, a current i(t).

The current i(t) flows in part in the first suspended element 12 and in part in the second suspended element 14, without traversing, to a first approximation, the first suspended-element subregion 22, since the ends of this latter are at one and the same potential. More in particular, in each of the first and second suspended elements 12, 14 there flows substantially half of the current i(t). Consequently, in the presence of a magnetic field directed, for example, parallel to the axis z, each of the first and second suspended elements 12, 14 is subject to a Lorentz force $F_L(t)$, the modulus of which is $$F_L(t) = \frac{1}{2} \cdot i(t) \cdot L \cdot B$$

where B is the modulus of the magnetic induction.

Under the action of the Lorentz force $F_L(t)$, each of the first and second suspended elements 12, 14 undergoes elastic deformation in such a way that its own central portion translates parallel to the axis x.

The first and second suspended elements 12, 14 hence function as springs, the deformation of which entails a translation of the third suspended element 20 parallel to the axis x, the extent and direction of said translation being, respectively, proportional to the modulus and direction of the magnetic induction B. For instance, with reference once again to FIG. 1, in the presence of a magnetic field, the translation of the third suspended element 20 is such that the first and second cantilever elements 30, 32 move away, respectively, from the first and second fixed-electrode subregions 7a, 7b and approach, respectively, the third and fourth fixed-electrode subregions 9a, 9b.

In detail, assuming that, in the absence of magnetic field, i.e., in resting conditions, the third suspended element 20 is arranged in such a way that the first and second capacitors C1, C2 have one and the same capacitance $C_0$, in the presence of the magnetic induction B illustrated in FIG. 1, it is found that to a first approximation the first capacitor C1 assumes a value of capacitance equal to $C_0 - \Delta C$, whereas the second capacitor C2 assumes a value of capacitance equal to $C_0 + \Delta C$.

The transduction circuit 35 is designed to generate an electrical signal proportional to $\Delta C$, which is hence proportional to the modulus of the magnetic induction B and moreover indicates the direction of the latter. This electrical signal is also known as "measurement signal".

In greater detail, if we designate by $x_0$ the distance that separates, in resting conditions, one between the first and third fixed-electrode subregions 7a, 9a from the first cantilever element 30 (this distance being equal to the distance between one between the second and fourth fixed-electrode subregions 7b, 9b and the second cantilever element 32), we have that the sensitivity of the magnetometer 1 is, at a low frequency, $$\frac{\Delta C}{\Delta B}(t) = \frac{C_0}{x_0} \cdot \frac{F_L(t)}{B \cdot k} = \frac{C_0}{x_0} \cdot \frac{L}{k} \cdot i(t)$$

where k is the elastic stiffness of the deformable body formed by the first, second, and third suspended elements 12, 14, 20, i.e., the constant that links a force to which the deformable body is subject to the corresponding translation of its centroid with respect to the resting conditions. The elastic stiffness k is a function of the elastic stiffnesses of the first and second springs 12, 14.

This having been said, today two different techniques are known for driving Lorentz force magnetometers, these techniques being described in what follows once again with reference to the magnetometer 1 illustrated in FIG. 1.

According to a first driving technique, the current generator 40 operates in d.c., in such a way that the relation $i(t) = I_C$ applies. This driving technique is simple to implement; however, it entails that the magnetometer 1, when driven in this way, has a somewhat reduced sensitivity; moreover, the magnetometer 1 operates in a region where the electronic noise is rather high. To overcome at least in part this problem, it is possible to increase the value of the current $I_C$, with consequent increase in consumption, and/or to increase the surfaces of the plates of the first and second capacitors C1, C2, with consequent increase in the area of semiconductor material occupied by the magnetometer 1.

Furthermore, the first driving technique entails that the magnetometer 1 is sensitive also to external vibrations and accelerations.

According to a second driving technique, instead, the current generator 40 operates in a.c., and in particular operates in such a way that the current i(t) has a periodic waveform, for example of a sinusoidal or square-wave type, at a frequency $f_i$ equal to the resonance frequency $f_0$ of the transducer 2.

In greater detail, the transducer 2 is characterized by a respective transfer function $H_m(f)$, also known as frequency response, which sets in relation, as the frequency varies, the values of amplitude, in sinusoidal regime, of the Lorentz force $F_L(f)$, to which each of the first and second suspended elements 12, 14 is subject, with the corresponding values of amplitude of the translation X(f) of each of the first and second suspended elements 12, 14 with respect to the corresponding resting position, i.e., the position assumed in the absence of magnetic field. In particular, the transfer function is equal to the ratio $X(f)/F_L(f)$.

Figure 2:
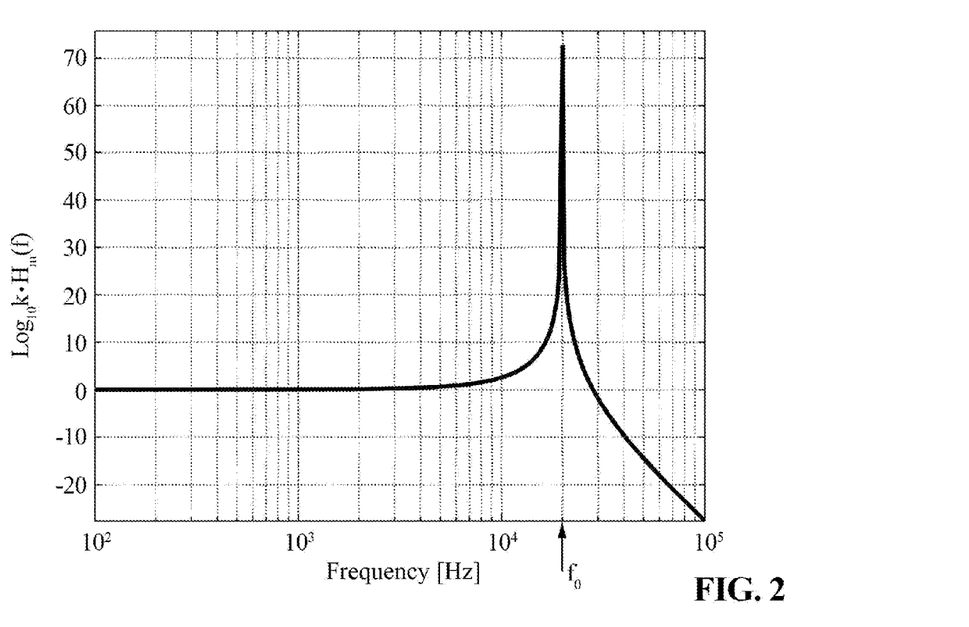
FIGS. 2 and 4 show plots of an example of a transfer function of a Lorentz force transducer.

FIG. 2 shows an example of the transfer function $H_m(f)$, which has a peak at a value of frequency equal, precisely, to the aforementioned resonance frequency $f_0$.

This having been said, the resonance frequency $f_0$ is not exactly known beforehand, in the sense that, even though it is possible to estimate, based on the characteristics of design of the transducer 2, a nominal resonance frequency $f_N$, i.e., an estimate of the resonance frequency $f_0$, this nominal resonance frequency $f_N$ does not coincide perfectly with the resonance frequency $f_0$. Furthermore, over time, the resonance frequency $f_0$ may vary, for example on account of temperature variations. Consequently, in order to guarantee that the frequency $f_i$ of the current i(t) is effectively equal to the resonance frequency $f_0$, the current generator 40 is controlled in closed-loop fashion in such a way that the frequency $f_1$ of the current i(t) follows the resonance frequency $f_0$.

The second driving technique enables to obtain a sensitivity that is higher than that obtained by the first driving technique. However, the implementation of a closed-loop control, which is based upon generation of an oscillating signal with an amplitude that varies together with the amplitude of the magnetic field, entails an increase in the circuit complexity. In addition, high sensitivity and resolution may be obtained at the expense of bandwidth. In this connection, in fact, it should be noted how the impact of Brownian noise on the performance of the transducer 2, when the latter is driven with the second driving technique, is directly proportional to the damping coefficient of the peak of the transfer function $H_m(f)$. Consequently, by reducing the damping coefficient, the effects of the noise are reduced, and hence the resolution increases; this means that the peak narrows and hence the sensitivity increases, given that the latter may be expressed as:

$$\frac{\Delta C}{\Delta B} = \frac{C_0}{x_0} \cdot \frac{F_L}{B \cdot k} = \frac{C_0}{x_0} \cdot \frac{L}{k} \cdot |i(t)| \cdot Q$$

where Q is the quality factor of the peak of the transfer function $H_m(f)$. However, the fact that the peak narrows moreover means that the bandwidth is reduced, since the latter is approximately equal, in this driving conditions, to $f_0/(2Q)$. For these reasons, generally the bandwidths of magnetometers driven with the second driving technique are in the region of a few hertz.

Moreover, the adoption of the second driving technique entails that the current generator 40 and the corresponding closed-loop control cannot be used for supplying further transducers additional to the transducer 2, for example integrated in a single chip together with the transducer 2 to form a multiaxial magnetic sensor. In fact, each of these further transducers has a respective resonance frequency, which is inevitably different from the resonance frequency $f_0$ of the transducer 2. Consequently, each of the further transducers is coupled to a respective current generator, controlled in closed-loop fashion in such a way that the frequency of the current generated thereby will follow the resonance frequency of the further transducer. Consequently, the current used by a triaxial magnetic sensor is three times the current used by a uniaxial magnetic sensor.

BRIEF SUMMARY

The present disclosure is directed to providing a magnetic sensor including a Lorentz force transducer that will enable at least a partial solution of the drawbacks of the prior art.

One embodiment of the present disclosure includes magnetic-field sensor that includes a die, a current generator in the die and configured to generate a driving current, and a first Lorentz force transducer in the die, coupled to the current generator and having a first resonance frequency, the driving current has a non-zero frequency different from the first resonance frequency.

BRIEF DESCRIPTION OF THE SEVERAL VIEWS OF THE DRAWINGS

For a better understanding of the disclosure, embodiments thereof are now described, purely by way of non-limiting example and with reference to the attached drawings, wherein.

DETAILED DESCRIPTION

Figure 3:
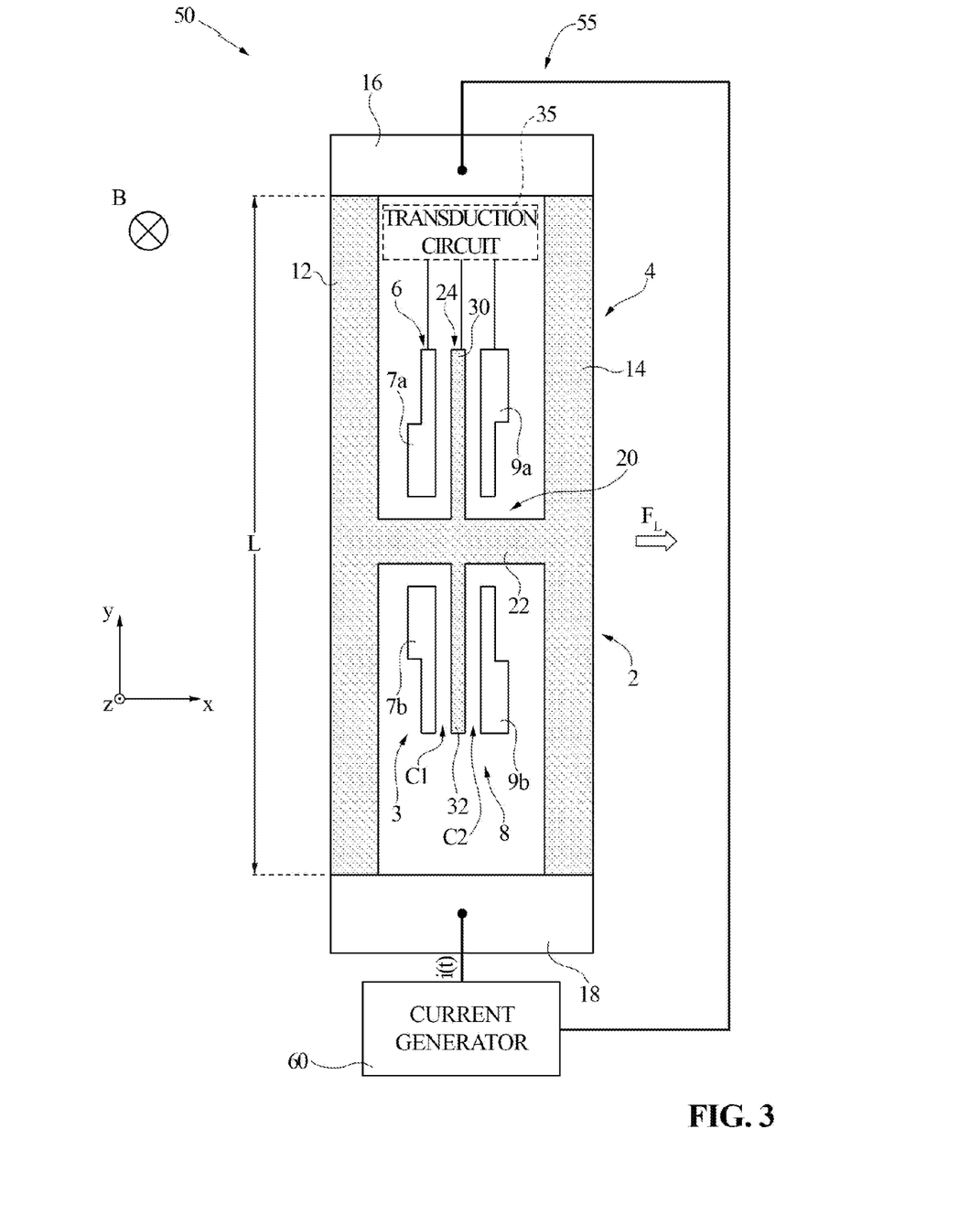
FIG. 3 is a schematic illustration of a cross section of an embodiment of the present magnetic sensor.

FIG. 3 illustrates a magnetic sensor 50, which comprises a Lorentz force transducer 55, referred to hereinafter as "transducer 55", and a current generator 60. Purely by way of non-limiting example, it is assumed that the transducer 55 is the same as the transducer 2 illustrated in FIG. 1; moreover, components of the transducer 55 already present in the transducer 2 illustrated in FIG. 1 are designated by the same reference numbers, except where otherwise specified.

In detail, the current generator 60 generates a periodic current i(t) with a frequency $f_i$. The waveform of the current i(t) may be, for example, a square or sinusoidal wave.

Figure 4:
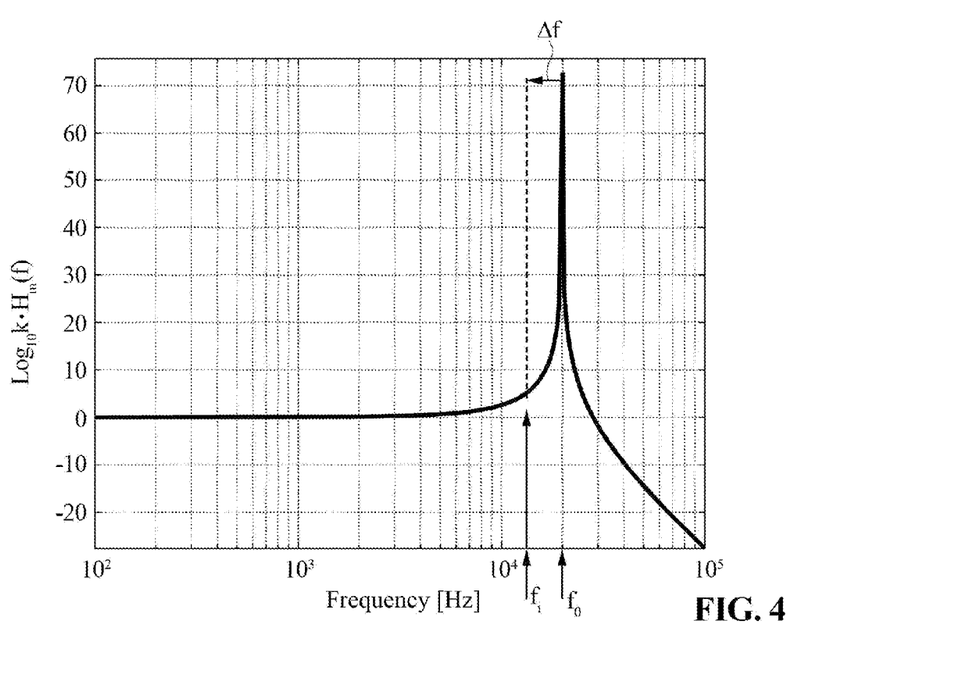

In greater detail, the transducer 55 has a resonance frequency $f_0$. Furthermore, as illustrated in FIG. 4, the frequency $f_i$ of the current i(t) is fixed in time and differs from the resonance frequency $f_0$ by a deviation $\Delta f$, the modulus of which may be comprised, for example, in the interval [500 Hz-1000 Hz], and in any case is not less than $G \cdot f_0/(2 \cdot Q)$, with G equal to 10. More in particular, the current generator 60 generates the current i(t) in such a way that the frequency $f_i$ is independent of the resonance frequency $f_0$. Consequently, the deviation $\Delta f$ may undergo variations over time.

Provided purely by way of example are possible embodiments in which $f_0$=20 kHz and $\Delta f$=−1 kHz, so that $f_i$=19 kHz.

In the above driving conditions, it is found that the bandwidth of the transducer 55, and hence of the magnetic sensor 50, is approximately $|\Delta f|/3$; consequently, it can be particularly wide. Furthermore, the bandwidth of the transducer 55 is independent of the damping coefficient of the peak of the transfer function $H_m(f)$ of the transducer 55 itself. Consequently, the damping coefficient can be reduced in order to reduce the impact of the Brownian noise, without this entailing any reduction of the bandwidth of the transducer 55. Furthermore, the operating point of the transducer 55 is affected marginally by the manufacturing tolerances of the transducer itself, since the latter operates at a point of the transfer function $H_m(f)$ where, in addition to assuming a value higher than the value at zero frequency, it has a limited slope.

The fact that the transducer 55 will be driven with a current having a frequency different from the resonance frequency $f_0$ entails a reduction in sensitivity as compared to the case of driving at the resonance frequency. This reduction in sensitivity can be compensated, for example, by modifying the conductive path along which the current i(t) flows within the transducer. For instance, embodiments of the transducer 55 are possible, which comprise a greater number of suspended elements, and/or a greater number of fixed-electrode subregions and of corresponding cantilever elements than what is illustrated in FIG. 3. In this case, it is possible to form one or more coils of conductive material, within which the current i(t) is made to circulate so as to increase the sensitivity, given the same current used.

In general, as mentioned previously, moreover possible are embodiments in which the mechanism of transduction of the Lorentz force into a variation of a corresponding mechanical quantity, which corresponds, in turn, to a variation of a corresponding electrical quantity, is different from what is illustrated in FIGS. 1 and 3. Embodiments are hence, for example, possible that are sensitive to the components of the magnetic field directed parallel to the axes x and/or y, instead of the axis z.

Provided purely by way of example are possible embodiments in which there is a rotation, instead of a translation, of a suspended element; this rotation is obtained once again by causing the current i(t) to flow within the suspended element. Furthermore, embodiments are possible in which the aforementioned corresponding electrical quantity is different from a capacitance; for example, this electrical quantity may be the electrical resistance of a piezoresistive element.

Figure 5:
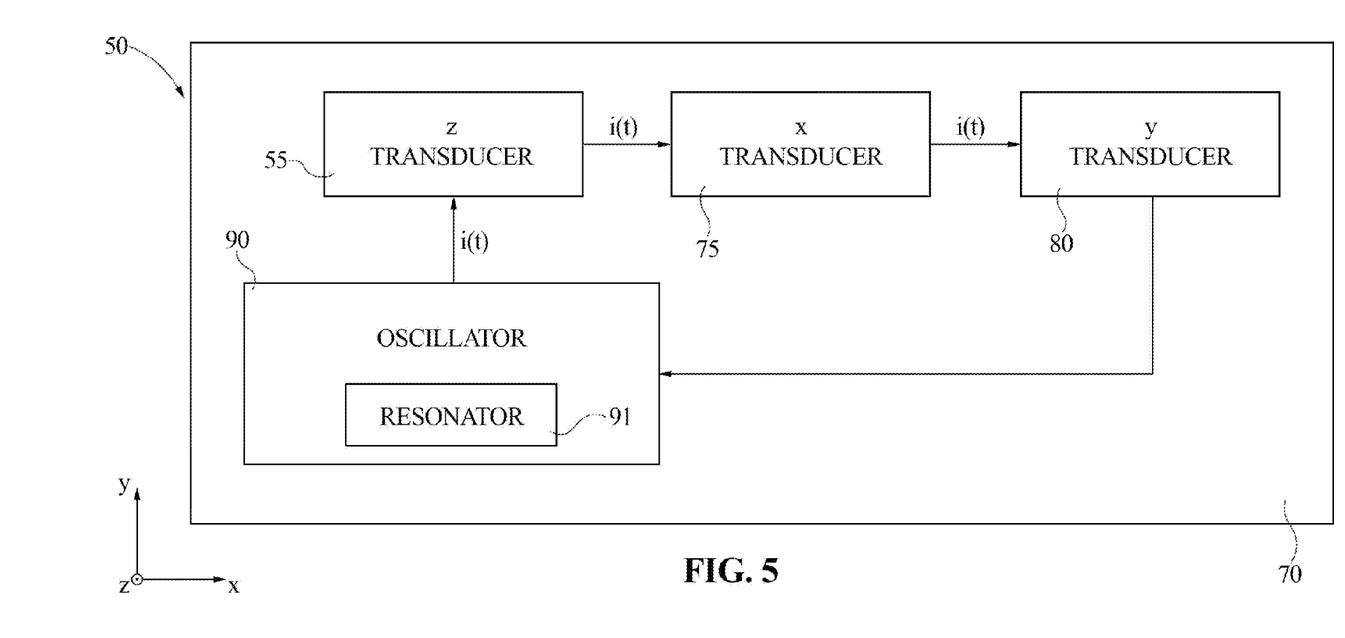
FIG. 5 shows a block diagram of an embodiment of the present magnetic sensor.

As illustrated in FIG. 5, moreover possible are embodiments in which the magnetic sensor 50 is integrated within a die 70, made of semiconductor material, and comprises, in addition to the current generator (here designated by 90) and to the transducer 55, referred to hereinafter as "first transducer 55", a second transducer 75 and a third transducer 80.

In detail, the first, second, and third transducers 55, 75, 80 are such that the first transducer 55 is sensitive, as mentioned previously, to the magnetic fields directed parallel to the axis z, whereas the second and third transducers 75, 80 are sensitive to magnetic fields directed, respectively, parallel to the axis x and to the axis y. In this way, the magnetic sensor 50 is of a triaxial type.

For instance, one between the second and third transducers 75, 80 may be the same as the first transducer 55, but oriented in a way different from the latter. In general, in any case, in each from among the first, second, and third transducers 55, 75, 80 the modulus of the Lorentz force is proportional to the modulus of the current i(t).

In greater detail, the first, second, and third transducers 55, 75, 80 are connected in series to one another.

Furthermore, the current generator 90 is connected to the terminals of the series formed by the first, second and third transducers 55, 75, 80. Consequently, the current i(t) traverses in succession the first, second, and third transducers 55, 75, 80. Furthermore, if we designate, respectively, by $f_{0z}$, $f_{0x}$ and $f_{0y}$, the resonance frequencies of the first, second and third transducers 55, 75, 80, the frequency $f_i$ of the current i(t) differs from these resonance frequencies, respectively, by a first deviation $\Delta f_z$, a second deviation $\Delta f_x$, and a third deviation $\Delta f_y$, each of which has a modulus comprised, for example, in the interval [500 Hz-1000 Hz]; in particular, if we designate by $\Delta f_i$ any one of $\Delta f_z$, $\Delta f_x$ and $\Delta f_y$, the relation $\Delta f_i > G \cdot f_0/(2 \cdot Q)$ still applies.

Furthermore, the frequency $f_i$ of the current i(t) is such that each from among the first, second, and third transducers 55, 75, 80 operates at a point of its own transfer function, in which the transfer function itself assumes a value higher than the value assumed at zero frequency.

In practice, the first, second, and third transducers 55, 75, 80 are not driven at the respective resonance frequency, thus, it is possible to use the same current for driving all the transducers. Furthermore, the current i(t) is generated using an oscillator circuit 90 (FIG. 5) of a known type, which forms the current generator, is integrated in the die 70, and has a nominal operating frequency that differs from the nominal resonance frequencies of the first, second, and third transducers 55, 75, 80, respectively, by the aforementioned first, second, and third deviations $\Delta f_z$, $\Delta f_x$ and $\Delta f_y$.

In greater detail, the oscillator circuit 90 is of a MEMS type; namely, it includes a resonator 91 of a MEMS type, which functions as frequency-selective element and includes a resonant electromechanical structure. In this way, the oscillator circuit 90 has process tolerances similar to the tolerances that afflict the first, second, and third transducers 55, 75, 80, since they are all integrated in the die 70, if possible close to one another. Consequently, the relations present between the nominal values of the resonance frequencies of the first, second, and third transducers 55, 75, 80 and the nominal frequency of the current i(t) are substantially equal to the relations present between the corresponding real values.

Figure 6:
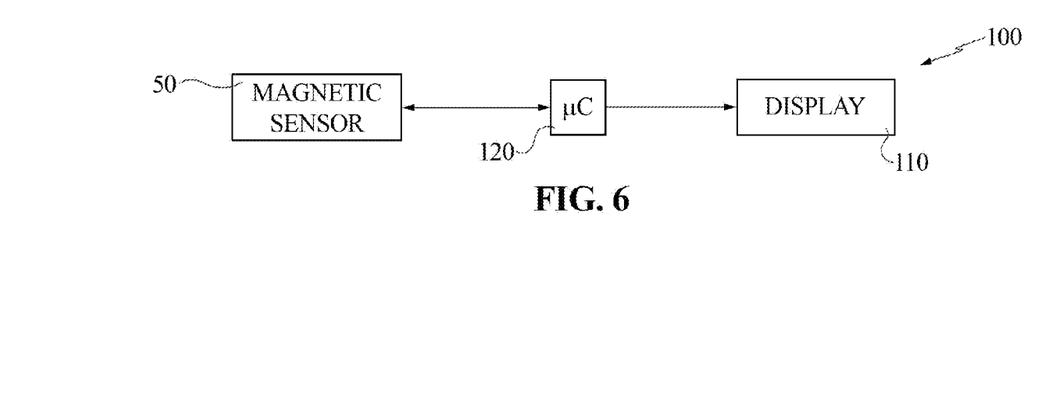
FIG. 6 shows a block diagram of an electronic system including the present magnetic sensor.

FIG. 6 shows an electronic system 100, which comprises any embodiment of the magnetic sensor 50, a display 110, and a processing unit 120, for example of the microcontroller type.

The processing unit 120 can receive appropriate external control signals through an interface (not shown) provided for this purpose. Furthermore, the processing unit 120 is electrically connected to the magnetic sensor 50 so as to receive the measurement signal. Moreover, the processing unit 120 is connected to the display 110 so as to supply to the latter a processed signal, generated by the processing unit 120 itself on the basis of the measurement signal. The processed signal is then displayed on the display 110.

The advantages that the present magnetic sensor affords emerge clearly from the foregoing description. In particular, the present magnetic sensor features low levels of consumption and a good resolution (low noise), as well as an appreciable bandwidth. Furthermore, the present magnetic sensor is characterized by the possibility of including a number of transducers supplied in series and integrated in one and the same die.

Finally, it is evident that modifications and variations may be made to the magnetic sensor described herein, without thereby departing from the scope of the present disclosure.

For instance, the first transducer 55 and the oscillator circuit 90 may be integrated in one and the same die even in the absence of further transducers; also in this case, the oscillator circuit 90 may be of a MEMS type. In general, moreover, it is possible, irrespective of the number of transducers present, for part of the oscillator circuit, and hence of the current generator, to be integrated in the die. In particular, it is possible for the resonator 91 to be integrated; further components of the oscillator circuit may then be formed outside the die. On the other hand, it is also possible for the resonator not to be of a MEMS type, but, for example, to be an electronic resonator of a known type.

The magnetic sensor may moreover comprise one or more MEMS gyroscopes, which may be integrated in the same die as that in which the first transducer 55 and, if present, the second and third transducers 75, 80 are formed.

Finally, each from among the current generator and the first, second, and third transducers may be of a tunable type; for example, in the case of the transducers, these may be electrostatically tunable. In this way, it is possible to obtain a precise control of the deviation $\Delta f$.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A magnetic-field sensor, comprising:
   a die;
   a first Lorentz force transducer formed in the die, the first Lorentz force transducer having a first resonance frequency; and
   a current generator formed in the die and coupled to the first Lorentz force transducer, the current generator configured to generate a driving current having a non-zero frequency to drive the first Lorentz force transducer to sense a Lorentz force indicative of a magnetic field received by the magnetic-field sensor, the non-zero frequency being different than the first resonance frequency.

2. The magnetic sensor of claim 1, wherein the current generator comprises a micro-electromechanical resonator.

3. The magnetic sensor of claim 1, wherein the driving current comprises a square wave signal or a sinusoidal signal.

4. The magnetic sensor of claim 1 further comprising a second Lorentz force transducer formed in the die and coupled to the current generator, the second Lorentz force transducer having a second resonance frequency.

5. The magnetic sensor of claim 4, wherein the first and second Lorentz force transducers are coupled in series, and wherein the current generator is coupled across the first and second Lorentz force transducers.

6. The magnetic sensor of claim 5, wherein the first and second Lorentz force transducers are configured to be sensitive to components of the magnetic field oriented in a first direction and a second direction, respectively, the second direction being different than the first direction.

7. The magnetic sensor of claim 1, wherein the current generator is configured to generate the driving current independent of the first resonance frequency of the first Lorentz force transducer.

8. The magnetic sensor of claim 1, wherein the first Lorentz force transducer comprises a mobile element that is coupled to the current generator, and wherein the mobile element is configured so the driving current flows through the mobile element, the mobile element being subjected to the Lorentz force due to the magnetic field received by the magnetic sensor.

9. The magnetic sensor of claim 8, wherein the mobile element further comprises at least one cantilever element and first and second fixed-electrode elements arranged proximate each of the at least one cantilever element, the first Lorentz transducer configured to sense first and second capacitances between each at least one cantilever element and the corresponding first and second fixed-electrode elements, the first and second capacitances having values that are a function of the sensed Lorentz force.

10. A magnetic-field sensor, comprising:
a die;
a first Lorentz force transducer formed in the die, the first Lorentz force transducer having a first resonance frequency;
a second Lorentz force transducer formed in the die, the second Lorentz force transducer having a second resonance frequency; and
a current generator formed in the die and coupled to the first and second Lorentz force transducers, the current generator configured to generate a driving current having a non-zero frequency to drive the first and second Lorentz force transducers to sense a Lorentz force generated in response to a magnetic field applied to the magnetic-field sensor, the non-zero frequency of the driving current being different than the first and second resonance frequencies and the current generator not driving the first Lorentz force transducer with the driving current having the non-zero frequency equal to the first resonance frequency and not driving the second Lorentz force transducer with the driving current having the non-zero frequency equal to the second resonance frequency.

11. The magnetic sensor of claim 10, wherein each of the first and second Lorentz force transducers is configured to vary a corresponding mechanical quantity responsive to the Lorentz force generated in response to the magnetic field.

12. The magnetic sensor of claim 11, wherein magnitude of the Lorentz force in each of the first and second Lorentz force sensors is proportional to a magnitude of the driving current.

13. The magnetic sensor of claim 10, wherein the current generator comprises a micro-electromechanical resonator.

14. The magnetic sensor of claim 10, wherein the driving current comprises a square wave signal or a sinusoidal signal.

15. The magnetic sensor of claim 10, wherein the first and second Lorentz force transducers are coupled in series, and wherein the current generator is coupled across the first and second Lorentz force transducers.

16. The magnetic sensor of claim 15, wherein the first and second Lorentz force transducers are configured to be sensitive to components of the magnetic field oriented in a first direction and a second direction, respectively, the second direction being different than the first direction.

17. An electronic system, comprising:
a magnetic sensor including,
a plurality of Lorentz force transducers, each Lorentz force transducer having a respective resonance frequency; and
a current generator coupled to the first Lorentz force transducer, the current generator configured to generate a driving current having a non-zero frequency to drive the first Lorentz force transducer to sense a Lorentz force indicative of a magnetic field applied to the magnetic sensor, the non-zero frequency being different than the respective resonance frequencies; and
a processing unit electrically coupled to the magnetic sensor.

18. The electronic system of claim 17, wherein the plurality of Lorentz force transducers comprises first, second and third Lorentz force transducers coupled in series, and wherein the first, second and third Lorentz force transducers are configured to sense three different directions of the magnetic field applied to the magnetic sensor.

19. The electronic system of claim 18, wherein the first, second, and third Lorentz force transducers are formed on a single die.

20. The electronic system of claim 19 further comprising a display electrically coupled to the processing unit.

* * * * *